(12) United States Patent
Ohnuki

(10) Patent No.: US 11,049,871 B2
(45) Date of Patent: Jun. 29, 2021

(54) SEMICONDUCTOR STORAGE DEVICE AND MANUFACTURING METHOD OF SEMICONDUCTOR STORAGE DEVICE

(71) Applicant: TOSHIBA MEMORY CORPORATION, Minato-ku (JP)

(72) Inventor: Ryota Ohnuki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/558,654

(22) Filed: Sep. 3, 2019

(65) Prior Publication Data

US 2020/0235118 A1   Jul. 23, 2020

(30) Foreign Application Priority Data

Jan. 17, 2019  (JP) .............................. JP2019-006127

(51) Int. Cl.
| | | |
|---|---|---|
| H01L 21/28 | (2006.01) | |
| H01L 27/115 | (2017.01) | |
| H01L 27/11582 | (2017.01) | |
| G11C 8/14 | (2006.01) | |
| G11C 16/04 | (2006.01) | |
| H01L 27/11565 | (2017.01) | |
| G11C 5/06 | (2006.01) | |
| H01L 27/11578 | (2017.01) | |
| H01L 27/11551 | (2017.01) | |
| H01L 27/11519 | (2017.01) | |

(52) U.S. Cl.
CPC .. *H01L 27/11578* (2013.01); *H01L 27/11519* (2013.01); *H01L 27/11551* (2013.01); *H01L 27/11565* (2013.01)

(58) Field of Classification Search
CPC ......... H01L 29/66833; H01L 27/11565; H01L 21/0217; H01L 21/31116; H01L 29/7926; H01L 21/02164; H01L 21/31111; H01L 27/11582
See application file for complete search history.

(56) References Cited

U.S. PATENT DOCUMENTS 9,627,401 B2    4/2017  Tsuda et al.
2015/0200199 A1  7/2015  Sakamoto et al.
(Continued)

FOREIGN PATENT DOCUMENTS

| JP | 2016-92044 A | 5/2016 |
| JP | 2017-10951 A | 1/2017 |
| WO | WO 2015/115002 A1 | 8/2015 |

*Primary Examiner* — Brian Turner
(74) *Attorney, Agent, or Firm* — Oblon, McClelland, Maier & Neustadt, L.L.P.

(57) ABSTRACT

A semiconductor storage device of an embodiment includes a plurality of pillars extending in a predetermined direction, a plurality of first memory cells arrayed on a side surface on one side of each of the pillars along an extending direction of the pillars, a plurality of second memory cells arrayed on a side surface of on another side each of the pillars along the extending direction of the pillars, a plurality of first and second word lines arrayed in the extending direction of the pillars, and respectively connected to the first and second memory cells, and in a cell array in which the plurality of pillars is disposed, the plurality of pillars are periodically arrayed without interruption in a lead-out direction of the first word lines and the second word lines.

8 Claims, 17 Drawing Sheets

(56) References Cited

U.S. PATENT DOCUMENTS

| | | | |
|---|---|---|---|
| 2016/0099254 A1* | 4/2016 | Park | G11C 16/0483 |
| | | | 257/324 |
| 2016/0126252 A1* | 5/2016 | Tsuda | H01L 21/02164 |
| | | | 257/314 |
| 2016/0268293 A1* | 9/2016 | Kamigaichi | H01L 27/11582 |
| 2016/0276264 A1* | 9/2016 | Noda | H01L 27/11519 |
| 2017/0330892 A1* | 11/2017 | Honda | H01L 23/5226 |
| 2018/0286918 A1 | 10/2018 | Bandyopadhyay et al. | |
| 2019/0326313 A1* | 10/2019 | Cui | H01L 29/40117 |

* cited by examiner

SEMICONDUCTOR STORAGE DEVICE AND MANUFACTURING METHOD OF SEMICONDUCTOR STORAGE DEVICE

CROSS-REFERENCE TO RELATED APPLICATIONS

This application is based upon and claims the benefit of priority from Japanese Patent Application No. 2019-006127, filed on Jan. 17, 2019; the entire content of which are incorporated herein by reference.

FIELD

Embodiments described herein relate generally to a semiconductor storage device and a manufacturing method of a semiconductor storage device.

BACKGROUND

In a three-dimensional nonvolatile memory, for increasing the density of memory cells, a structure in which a plurality of columns of memory cells arrayed in a height direction is provided for one pillar has been known. In a three-dimensional nonvolatile memory having such a configuration, separation needs to be finely performed so as not to collapse word lines stacked in the height direction of the pillar.

DETAILED DESCRIPTION

A semiconductor storage device of an embodiment includes a plurality of pillars extending in a predetermined direction, a plurality of first memory cells arrayed on a side surface on one side of each of the pillars along an extending direction of the pillars, a plurality of second memory cells arrayed on a side surface of on another side each of the pillars along the extending direction of the pillars, a plurality of first word lines arrayed in the extending direction of the pillars, and respectively connected to the first memory cells, and a plurality of second word lines arrayed in the extending direction of the pillars, and respectively connected to the second memory cells, and in a cell array in which the plurality of pillars is disposed, the plurality of pillars are periodically arrayed without interruption in a lead-out direction of the first word lines and the second word lines.

Exemplary embodiments of the present invention will be explained below in detail with reference to the accompanying drawings. In addition, the present invention is not limited to the following embodiments. In addition, components in the following embodiments include components that can be easily conceived by the one skilled in the art, or substantially the same components.

(Configuration Example of Semiconductor Storage Device)

Figure 1A:
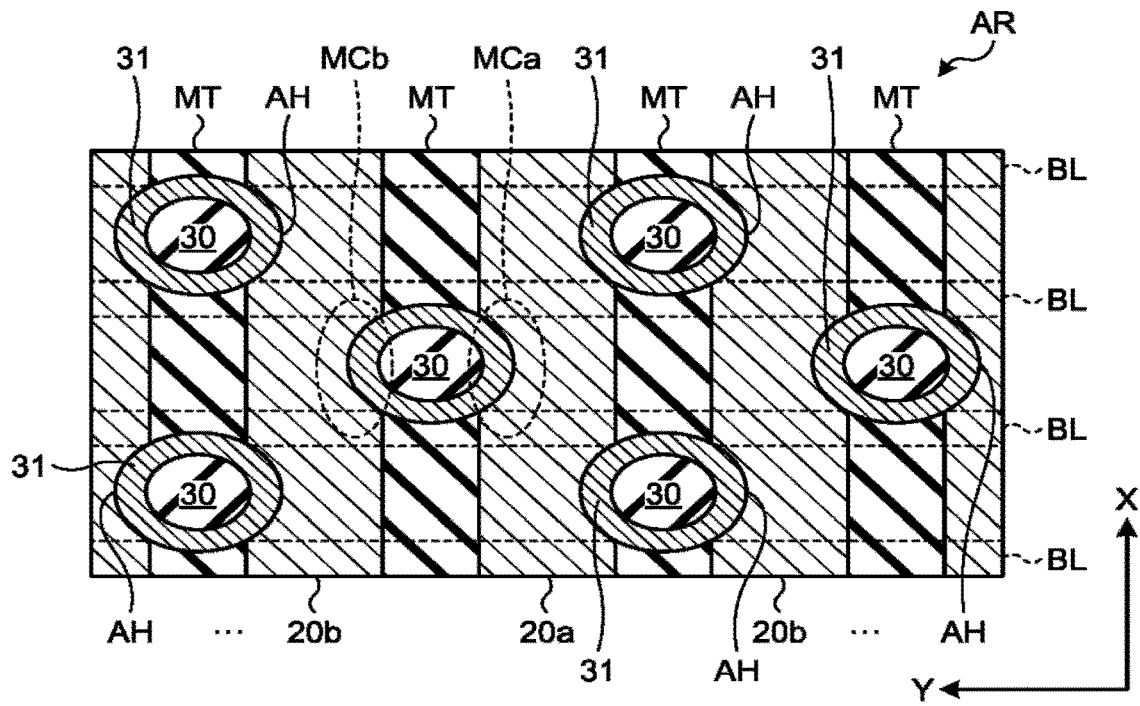
FIGS. 1A and 1B are diagrams illustrating a configuration example of a semiconductor storage device according to an embodiment.
Figure 1B:
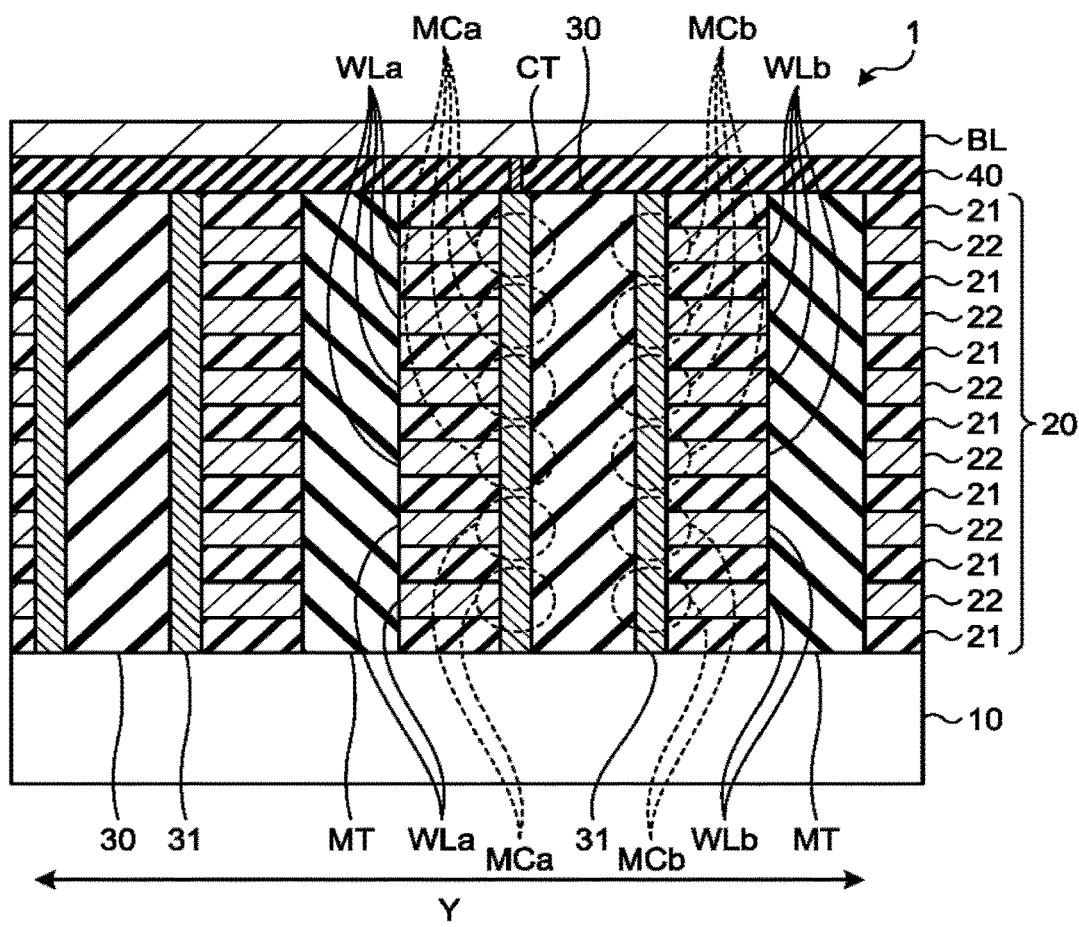

FIGS. 1A and 1B are diagrams illustrating a configuration example of a semiconductor storage device 1 according to an embodiment. FIG. 1A is a top view of the semiconductor storage device 1, and FIG. 1B is a cross-sectional view in a Y direction of the semiconductor storage device 1. In FIG. 1A, an insulating layer 40 is omitted, and bit lines BL are indicated by broken lines. In addition, the bit line BL and a contact CT in FIG. 1B are not actually located at the positions, and are illustrated for the sake of explanatory convenience.

As illustrated in FIGS. 1A and 1B, the semiconductor storage device 1 includes a stack 20 in which a plurality of insulating layers 21 and a plurality of conductive layers 22 are alternately stacked on a substrate 10 such as a silicon substrate. Nevertheless, the stack 20 needs not be disposed immediately above the substrate 10 if the stack 20 is disposed on a conductive layer serving as a source line. The insulating layer 21 is a $SiO_2$ layer or the like, for example, and functions as an interlayer insulating layer. The conductive layer 22 is a W layer or the like, for example, and functions as a word line WLa or WLb. The word lines WLa and WLb are led out in an X direction, and connected to a peripheral circuit for operating the word lines WLa and WLb. In addition, the number of stacked word lines WLa or WLb may be any number, and can be about 100 layers, for example.

The semiconductor storage device 1 includes insulating layers MT that penetrate through the stack 20, and serve as a plurality of separation layers extending in the X direction. The stack 20 is separated by the insulating layers MT into a plurality of stacks 20a and 20b. The conductive layers 22 are separated by the insulating layers MT into the word lines WLa and WLb.

The semiconductor storage device 1 includes a plurality of memory holes AH that penetrate through the stack 20, and are disposed at positions intersecting with the insulating layers MT. The memory holes AH have an ellipse or oval shape having a long diameter in the Y direction in a top vision. A ratio of a long diameter of a top surface serving as an opened surface of the memory holes AH, with respect to a short diameter of the top surface of the memory holes AH is 1.5 or more and 2.0 or less, for example. A ratio of a long diameter of a bottom surface serving as an end surface of the memory holes AH, with respect to a short diameter of the bottom surface of the memory holes AH is larger than 1.0, and preferably, 1.5 or more and 2.0 or less, for example.

By having an ellipse or oval shape, the memory holes AH are disposed in regions extending across regions in which the word lines WLa, the insulating layers MT, and the word lines WLb are disposed, in a top vision. It is preferable that the bottom surfaces of the memory holes AH are approximately flat, and have no level difference at boundary portions with the word lines WLa and WLb, and the insulating layers MT.

In a center portion of the memory hole AH, a core portion 30 serving as a pillar extending in a stacking direction of the stack 20 is disposed. The core portion 30 is formed by a $SiO_2$ layer or the like, for example. On the side wall of the core portion 30, a memory layer 31 is disposed so as to cover the core portion 30. The memory layer 31 is formed by stacking a plurality of layers. Specifically, the memory layer 31 includes, in order from the core portion 30 side, a channel layer, a tunnel insulating layer, a charge accumulation layer, and a block insulating layer. The channel layer of the memory layer 31 also covers the bottom surface of the core portion 30. The block insulating layer contacts an inner wall of the memory holes AH. The channel layer is, for example, an amorphous silicon layer, a polysilicon layer, or the like. The tunnel insulating layer and the block insulating layer are, for example, $SiO_2$ layers or the like. The charge accumulation layer is, for example, a SiN layer or the like.

By having the above-described configuration, the semiconductor storage device 1 includes memory cells MCa and MCb arrayed in the height position of the conductive layers 22, on the both side surfaces in the Y direction of the core portion 30. More specifically, on one side of the core portion 30 in the Y direction, the memory cells MCa serving as a plurality of first memory cells are arrayed, and these memory cells MCa are respectively connected to the word lines WLa serving as first word lines that are located at the same height position. In addition, on the other side of the core portion 30 in the Y direction, the memory cells MCb serving as a plurality of second memory cells are arrayed, and these memory cells MCb are respectively connected to the word lines WLb serving as second word lines that are located at the same height position.

In other words, according to the above-described configuration, a plurality of columns of memory cells MCa and MCb are arrayed for one core portion 30. With this configuration, array densities of the memory cells MCa and MCb can be increased, and higher density can be achieved. In this manner, a region in which the memory cells MCa and MCb are disposed will be referred to as a cell array AR. In the cell array AR, a plurality of core portions 30 each having the memory cells MCa and MCb arrayed in the height direction are disposed in a matrix in a top vision.

The semiconductor storage device 1 includes the plurality of bit lines BL extending in the Y direction, via the insulating layer 40, above the stack 20. A predetermined bit line BL is connected to a channel layer provided in a predetermined memory hole AH, via the contact CT. The bit line BL is led out in the Y direction, and connected to a peripheral circuit for operating the bit line BL.

Figure 2:
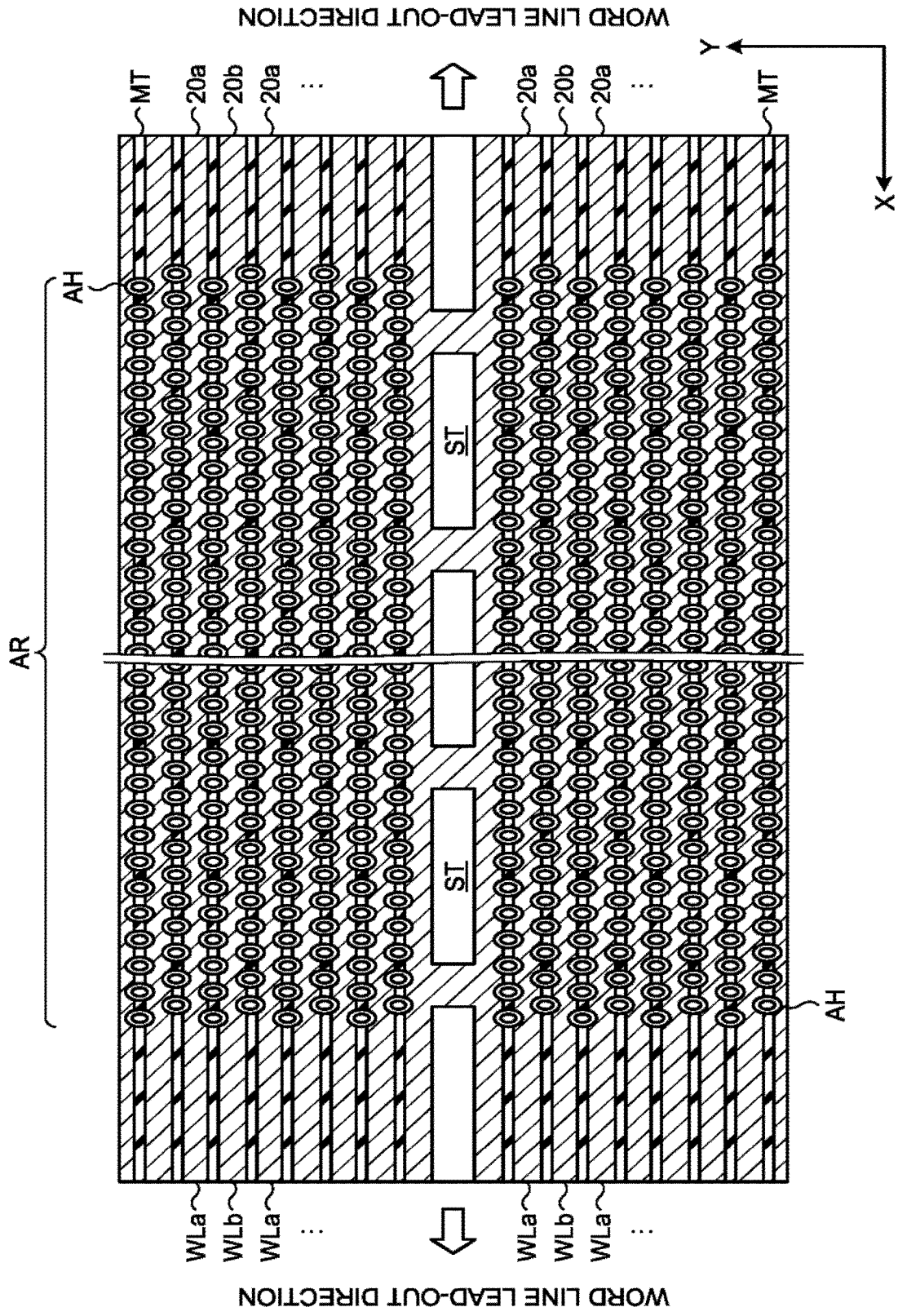
FIG. 2 is a diagram illustrating a cell array of a semiconductor storage device according to an embodiment.

FIG. 2 is a diagram illustrating the cell array AR of the semiconductor storage device 1 according to an embodiment. FIG. 2 is a plan view of the word lines WLa and WLb in any hierarchy that are disposed in the height direction.

As illustrated in FIG. 2, in the cell array AR, the insulating layers MT continuously extend in the X direction being a lead-out direction of the word lines WLa and MLb, and are periodically arrayed in the Y direction. Nevertheless, the periodicity of the insulating layers MT is partially interrupted in the Y direction by a slit ST extending in the X direction. The slit ST is a groove penetrating through the stack 20. In the slit ST, for example, a conductive layer such as a W layer is embedded, and functions as a source line contact, for example.

In the cell array AR, the memory holes AH are disposed so as to extend across the insulating layers MT in the Y direction, and are periodically arrayed without interruption in the X direction. Here, a state in which the memory holes AH are arrayed without interruption represents a state in which the periodicity of the array of the memory holes AH is maintained consecutively and continually. The memory holes AH are periodically arrayed also in the Y direction, but the periodicity of the memory holes AH is partially interrupted in the Y direction by the slit ST extending in the X direction.

(Example of Manufacturing Process of Semiconductor Storage Device)

Next, an example of a manufacturing process of the semiconductor storage device 1 according to an embodiment will be described using FIGS. 3A to 14B. FIGS. 3A to 14B are flow diagrams illustrating an example of a procedure of a manufacturing process of the semiconductor storage device 1 according to an embodiment. Among FIGS. 3A to 14B, FIGS. 3A, 4A, 5A, 6A, 7A, 8, 9A, 10A, 11A, 12A, 13A, and 14A are top views each illustrating the manufacturing process of the semiconductor storage device 1, and FIGS. 3B, 4B, 5B, 6B, 7B, 9B, 10B, 11B, 12B, 13B, and 14B are cross-sectional views in the Y direction each illustrating the manufacturing process of the semiconductor storage device 1.

Figure 3A:
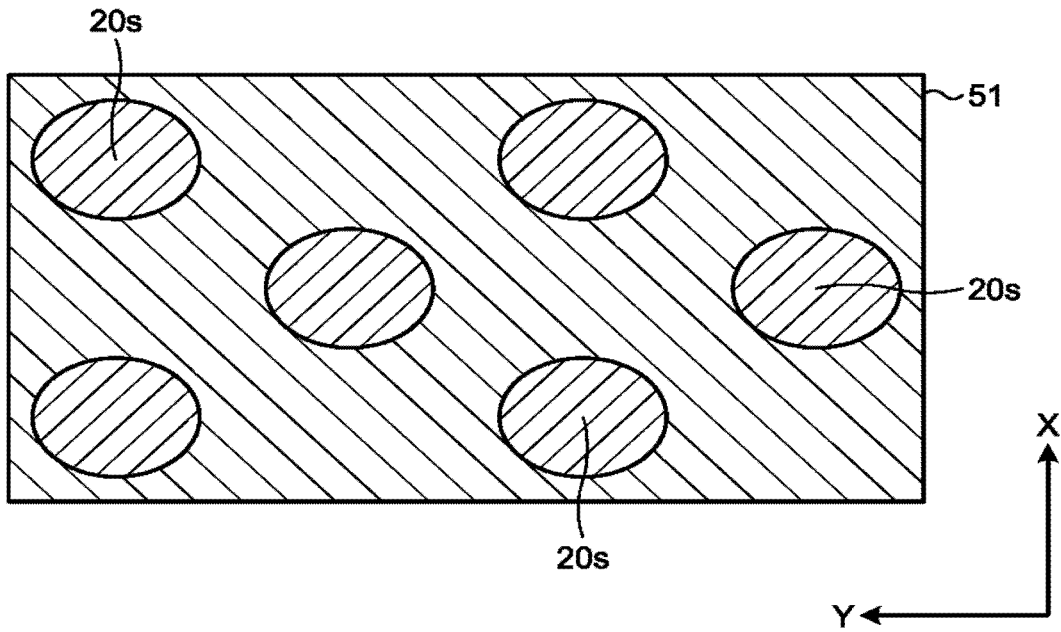
FIGS. 3A and 3B are flow diagrams illustrating an example of a procedure of a manufacturing process of a semiconductor storage device according to an embodiment.
Figure 3B:
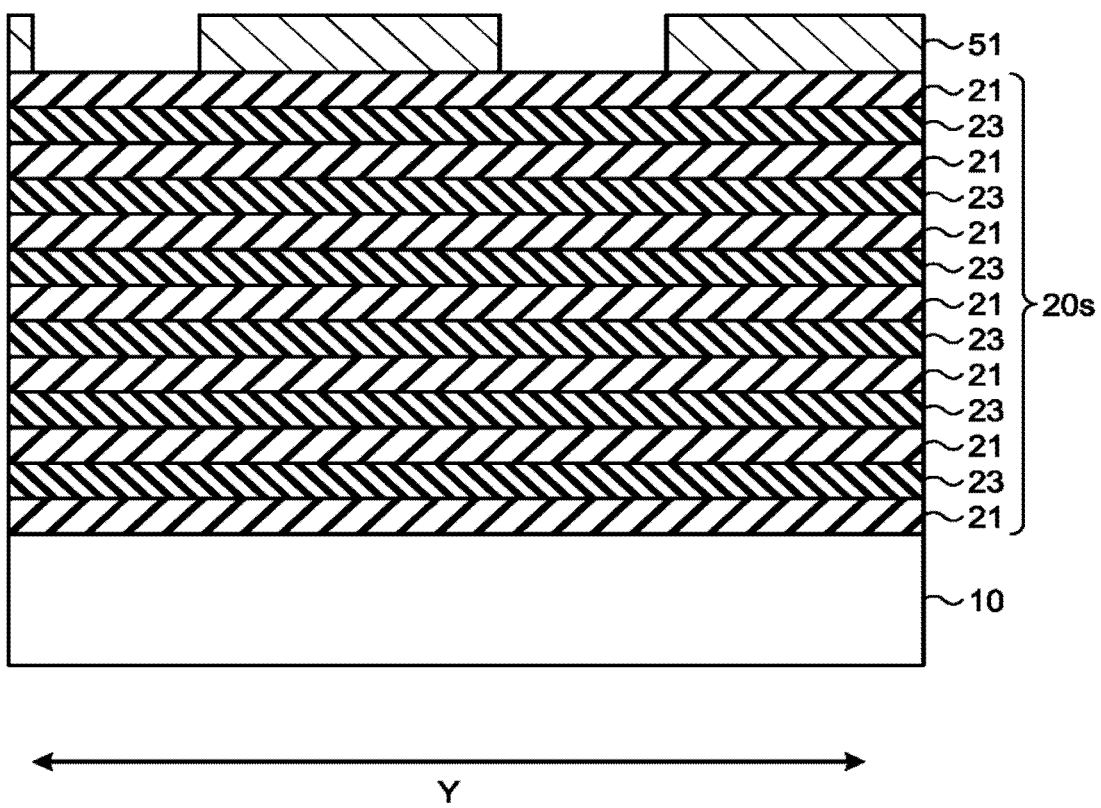

As illustrated in FIGS. 3A and 3B, a stack 20s in which a plurality of insulating layers 21 and a plurality of sacrificial layers 23 are alternately stacked is formed above the substrate 10. The sacrificial layer 23 is layer replaceable with the conductive layer 22 later, and is a SiN layer or the like, for example.

A CVD carbon layer 51 having a hole pattern is formed on the stack 20s. The CVD carbon layer 51 is an amorphous carbon layer formed by a Chemical Vapor Deposition (CVD) method.

Figure 4A:
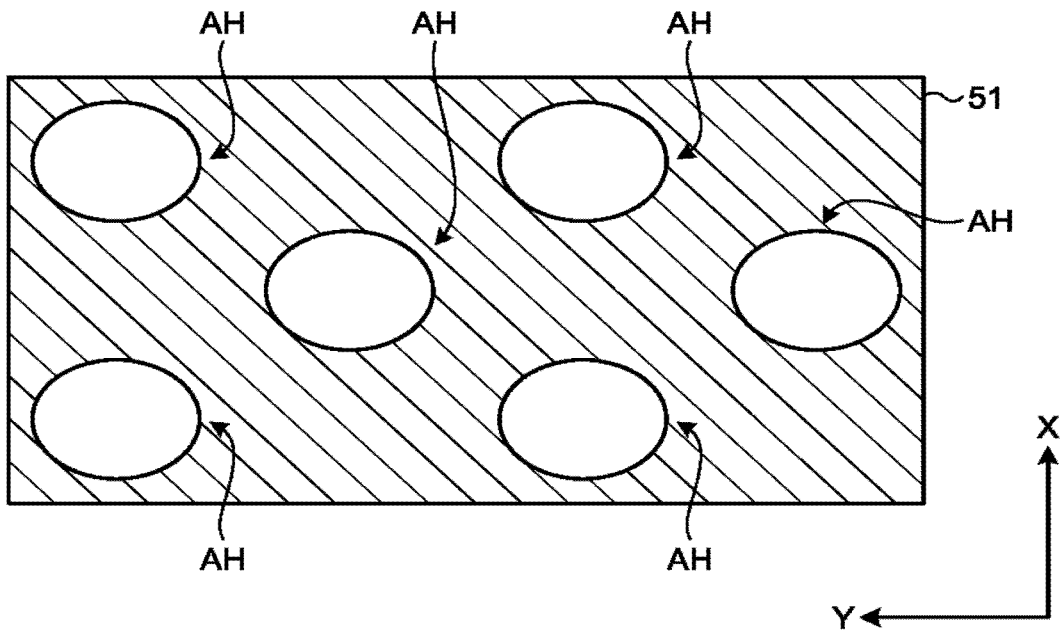
FIGS. 4A and 4B are flow diagrams illustrating an example of a procedure of a manufacturing process of a semiconductor storage device according to an embodiment.
Figure 4B:
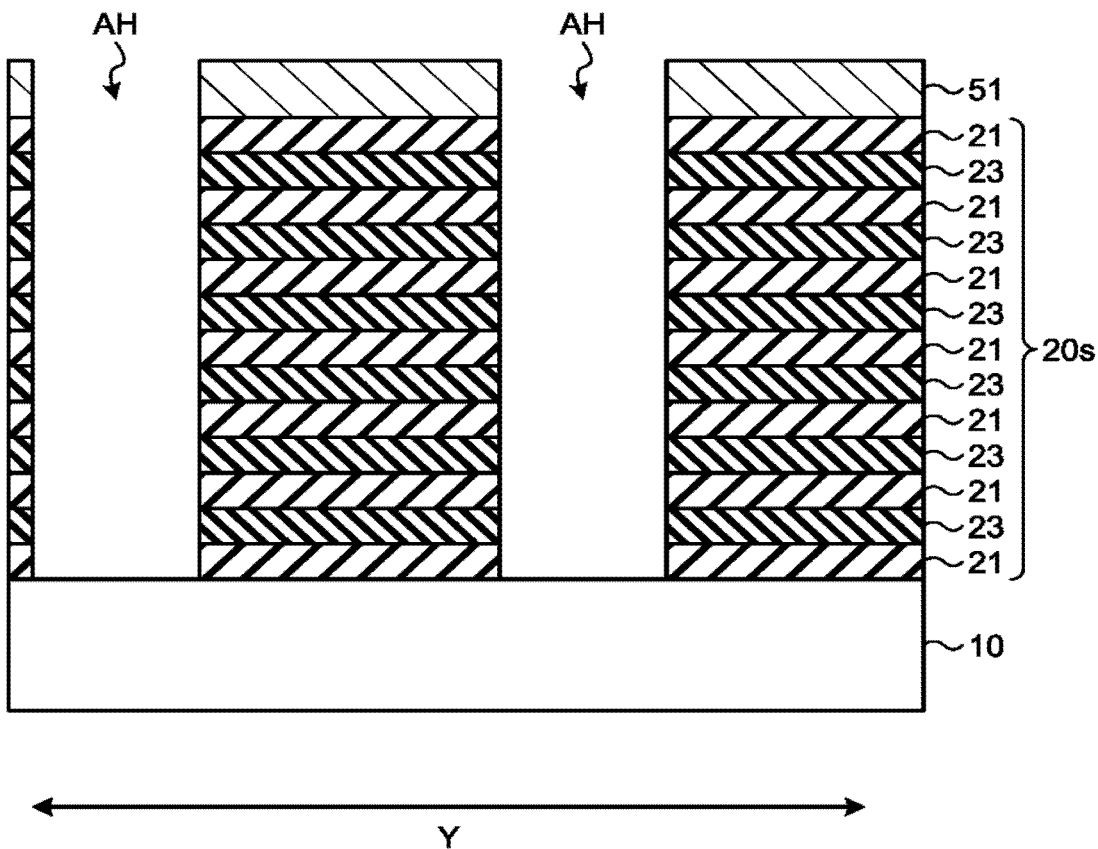

As illustrated in FIGS. 4A and 4B, a plurality of memory holes AH penetrating through the stack 20s is formed by using the CVD carbon layer 51 as a mask.

Figure 5A:
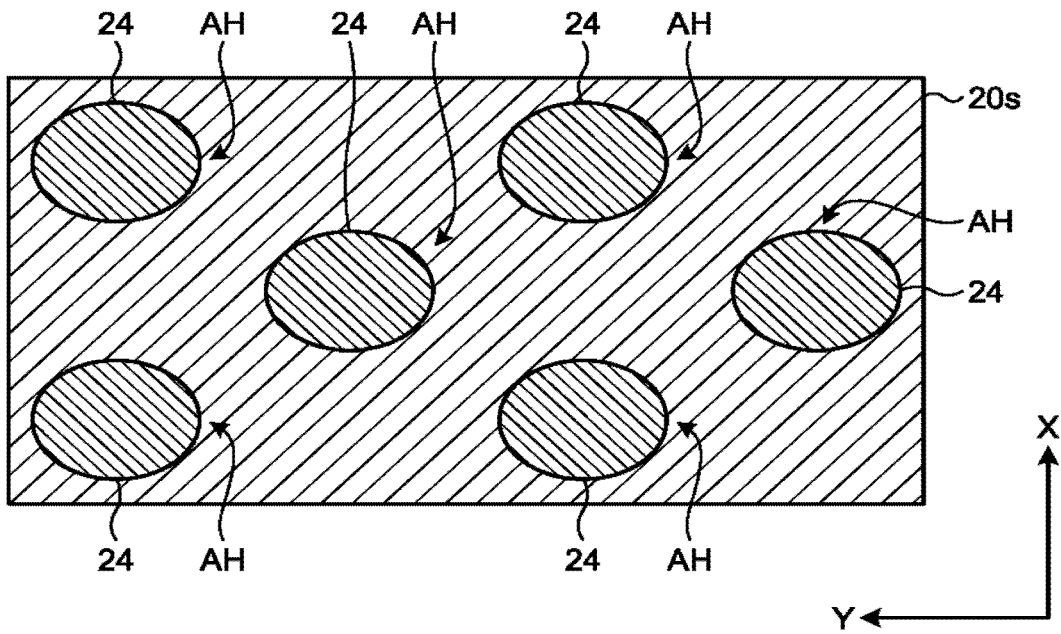
FIGS. 5A and 5B are flow diagrams illustrating an example of a procedure of a manufacturing process of a semiconductor storage device according to an embodiment.
Figure 5B:
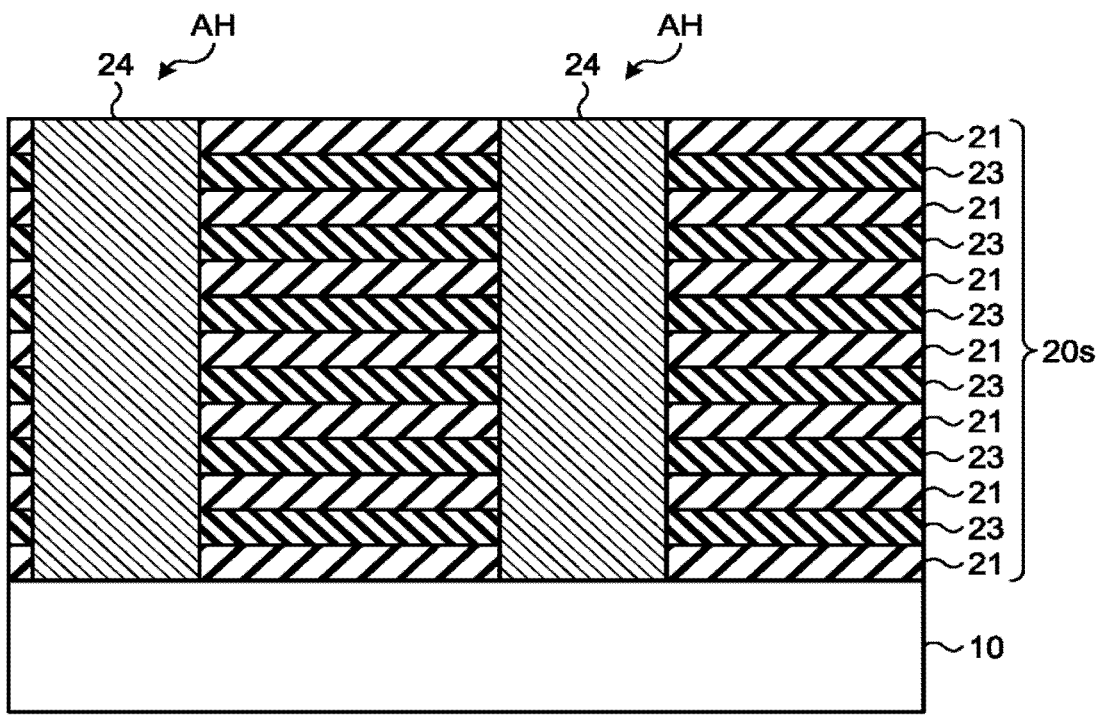

As illustrated in FIGS. 5A and 5B, the plurality of memory holes AH is filled with sacrificial layers 24. The sacrificial layer 24 is, for example, an amorphous silicon layer, a polysilicon layer, or the like.

Figure 6A:
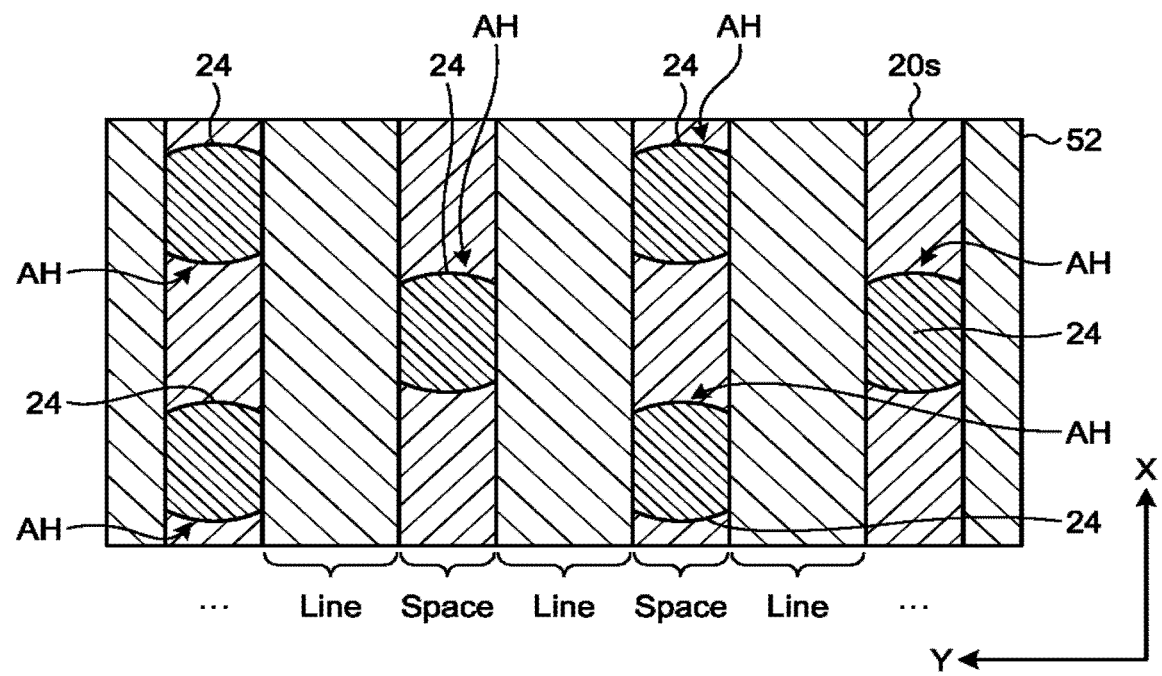
FIGS. 6A and 6B are flow diagrams illustrating an example of a procedure of a manufacturing process of a semiconductor storage device according to an embodiment.
Figure 6B:
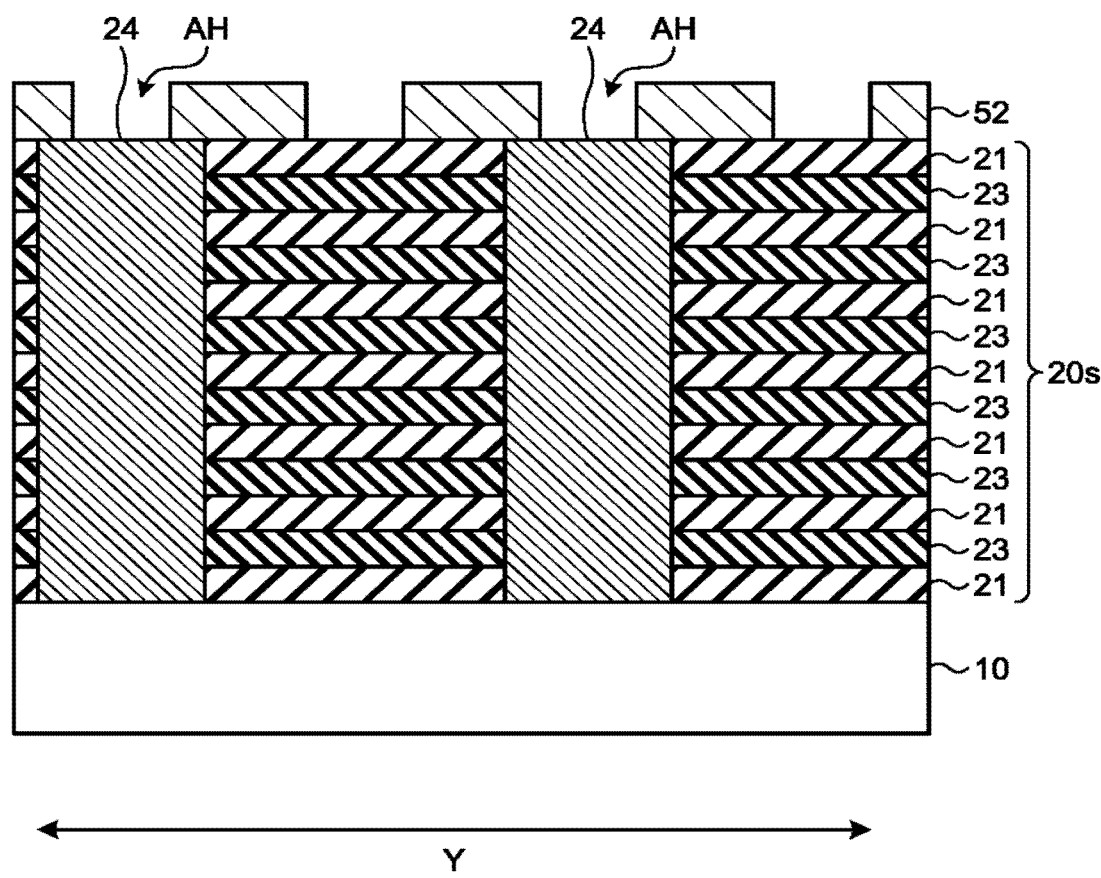

As illustrated in FIGS. 6A and 6B, a CVD carbon layer 52 having a line and space pattern is formed on the stack 20s. At this time, the CVD carbon layer 52 is formed in such a manner that a space pattern of the CVD carbon layer 52 is positioned on the memory hole AH filled with the sacrificial layer 24.

Figure 7A:
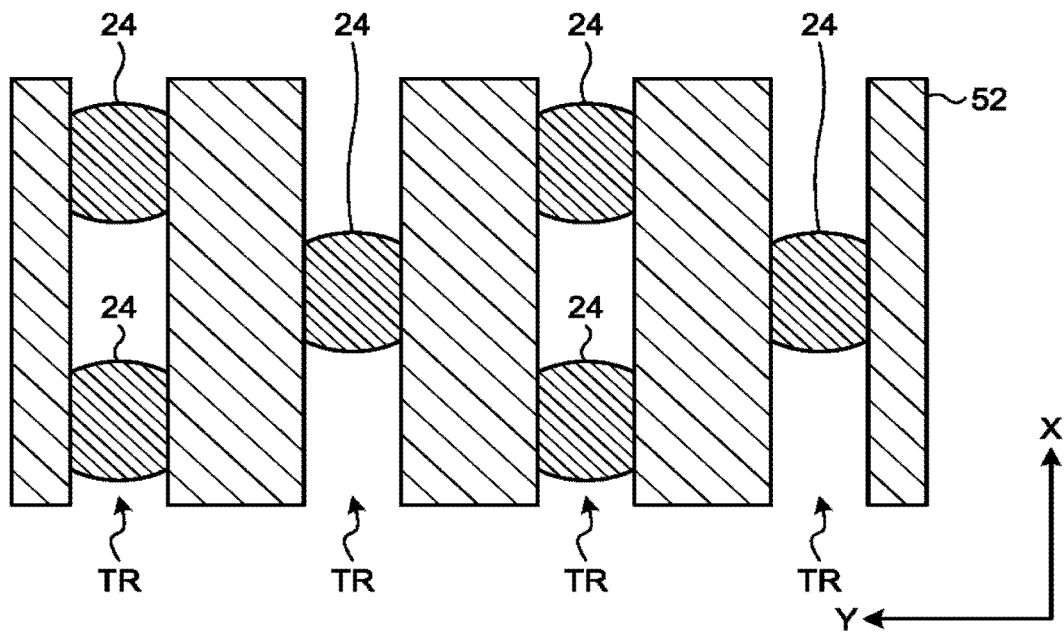
FIGS. 7A and 7B are flow diagrams illustrating an example of a procedure of a manufacturing process of a semiconductor storage device according to an embodiment.
Figure 7B:
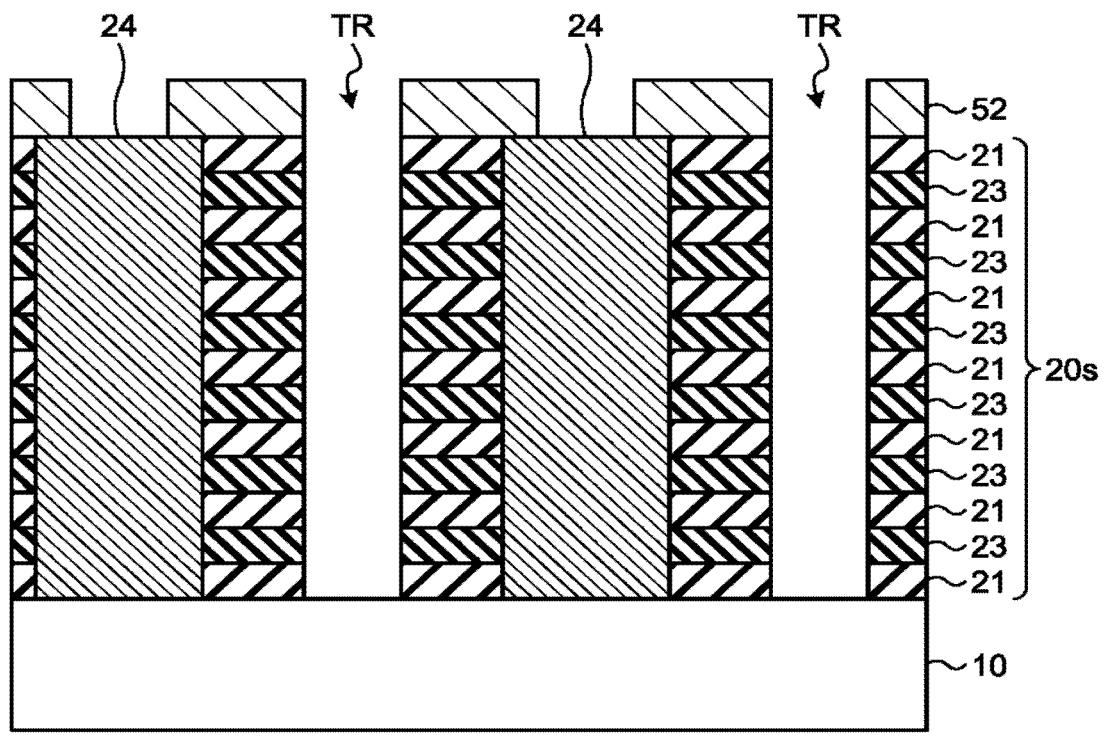
Figure 8:
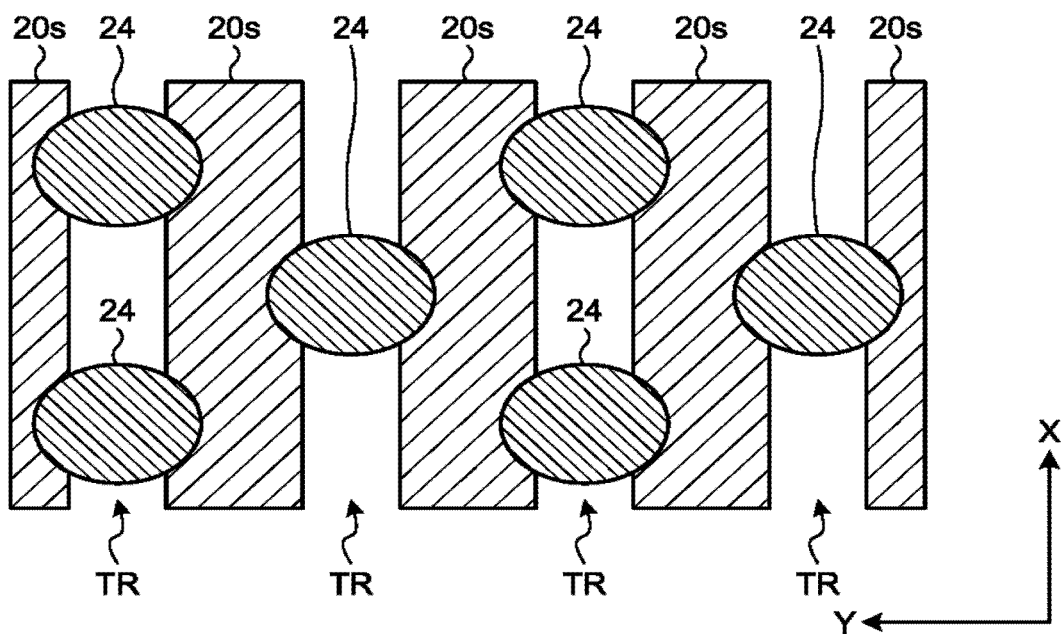
FIG. 8 is a flow diagram illustrating an example of a procedure of a manufacturing process of a semiconductor storage device according to an embodiment.

As illustrated in FIGS. 7A and 7B, a plurality of grooves TR penetrating through the stack 20s is formed by using the CVD carbon layer 52 as a mask. At this time, a condition of selectively removing the stack 20s formed by a $SiO_2$ layer and SiN layer, or the like, with respect to the sacrificial layer 24 formed by silicon-based material such as an amorphous silicon layer is used. With this configuration, the sacrificial layer 24 filling the memory holes AH remains without being removed. This state is illustrated in FIG. 8. FIG. 8 illustrates a top view at this time illustrating a state in which the CVD carbon layer 52 is omitted.

As illustrated in FIG. 8, the stack 20s is divided by the plurality of grooves TR into fine line shapes extending in the X direction. Between these the stacks 20s having line shapes, the sacrificial layers 24 having a pillar shape remain. The sacrificial layers 24 having a pillar shape bridge the stacks 20s having line shapes. In other words, the sacrificial layers 24 having a pillar shape connect between a plurality of stacks 20s having line shapes.

Figure 9A:
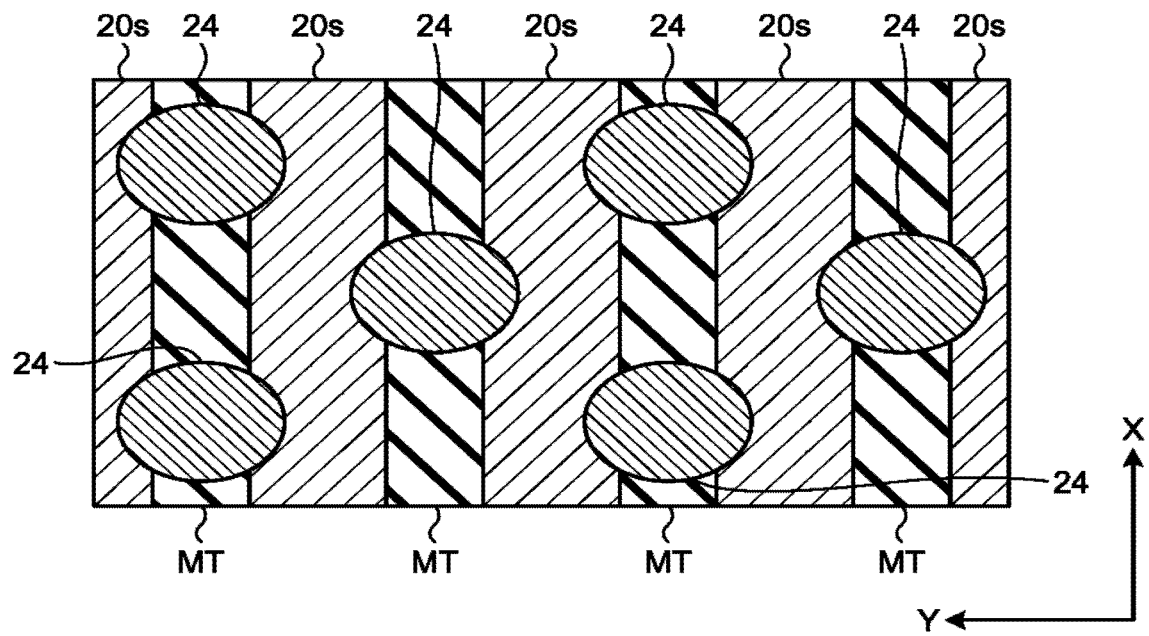
FIGS. 9A and 9B are flow diagrams illustrating an example of a procedure of a manufacturing process of a semiconductor storage device according to an embodiment.
Figure 9B:
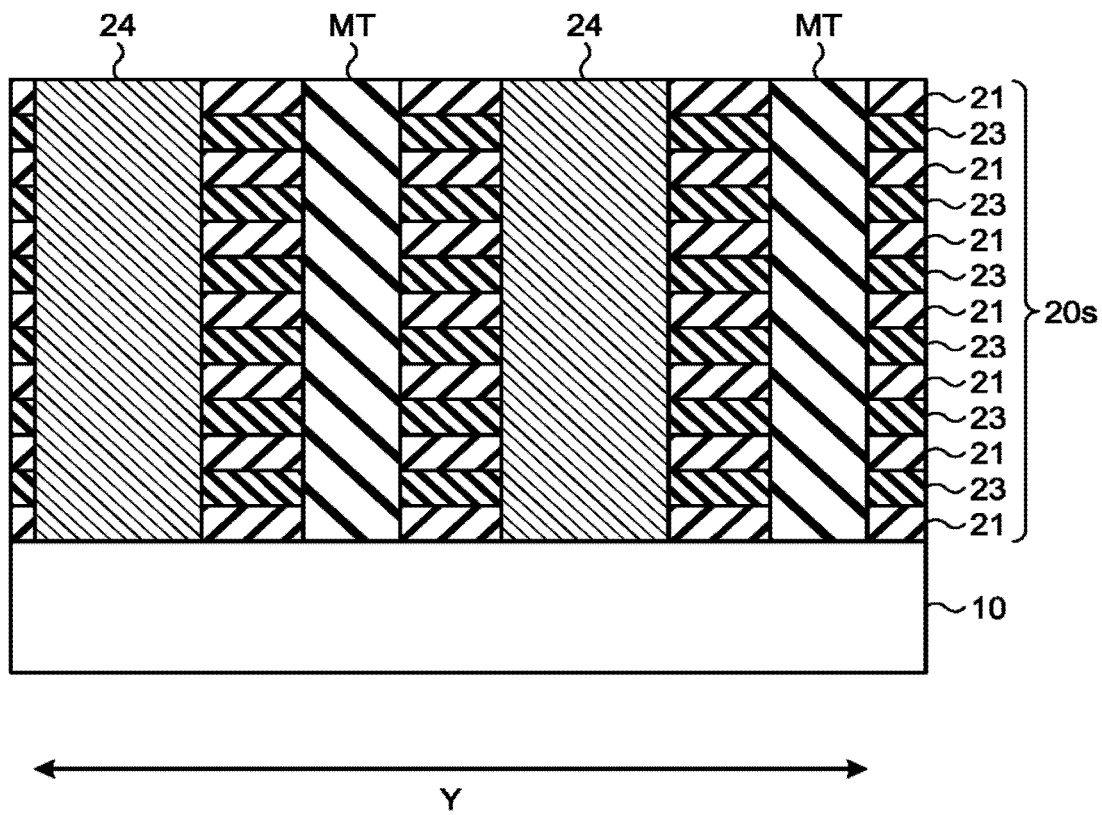

As illustrated in FIGS. 9A and 2B, grooves provided between the stacks 20s are filled with insulating material so that the insulating layers MT are formed.

Figure 10A:
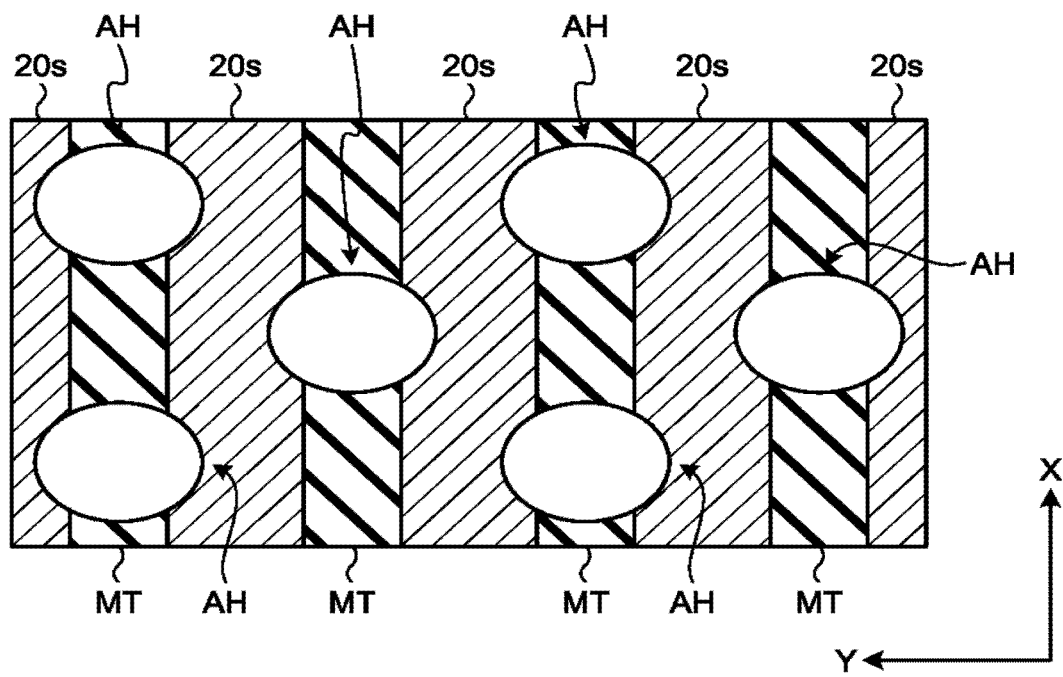
FIGS. 10A and 10B are flow diagrams illustrating an example of a procedure of a manufacturing process of a semiconductor storage device according to an embodiment.
Figure 10B:
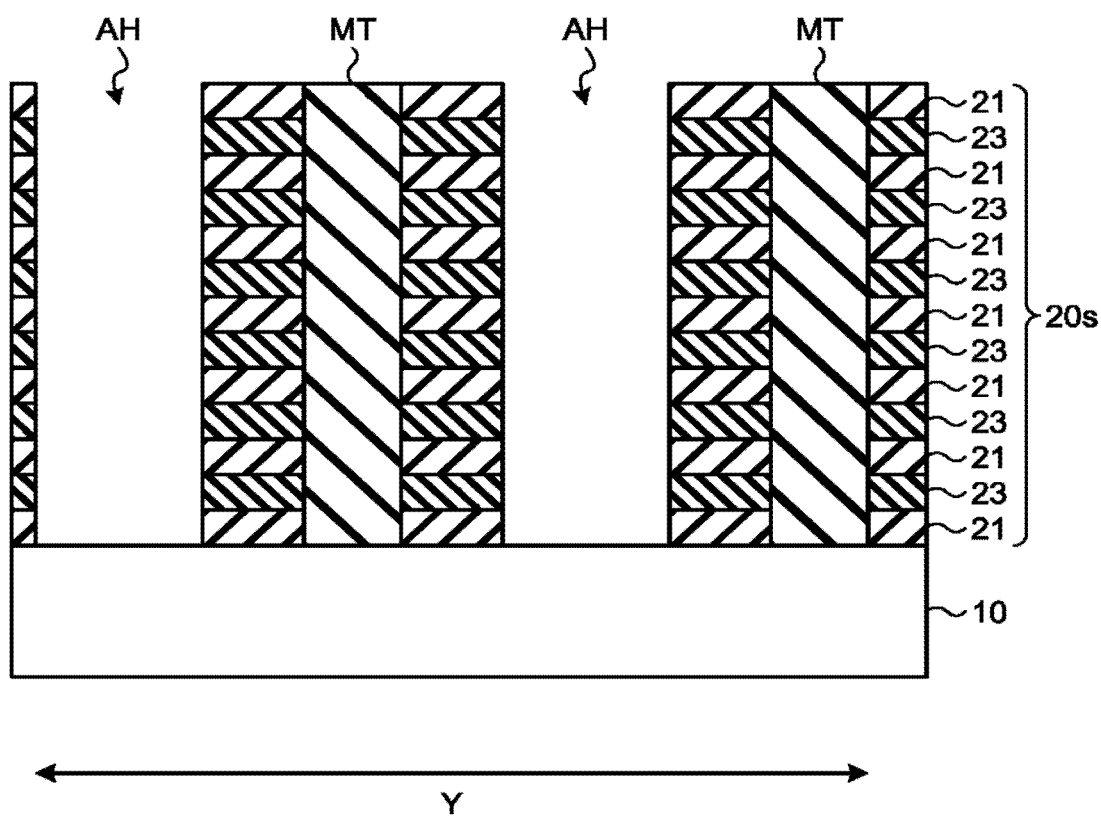

As illustrated in FIGS. 10A and 108, the sacrificial layers 24 are removed, and the memory holes AH are opened again. At this time, a condition of selectively removing silicon-based material such as amorphous silicon layer with respect to the insulating layers MT is used. With this configuration, the sacrificial layers 24 can be removed with the insulating layers MT being left.

Figure 11A:
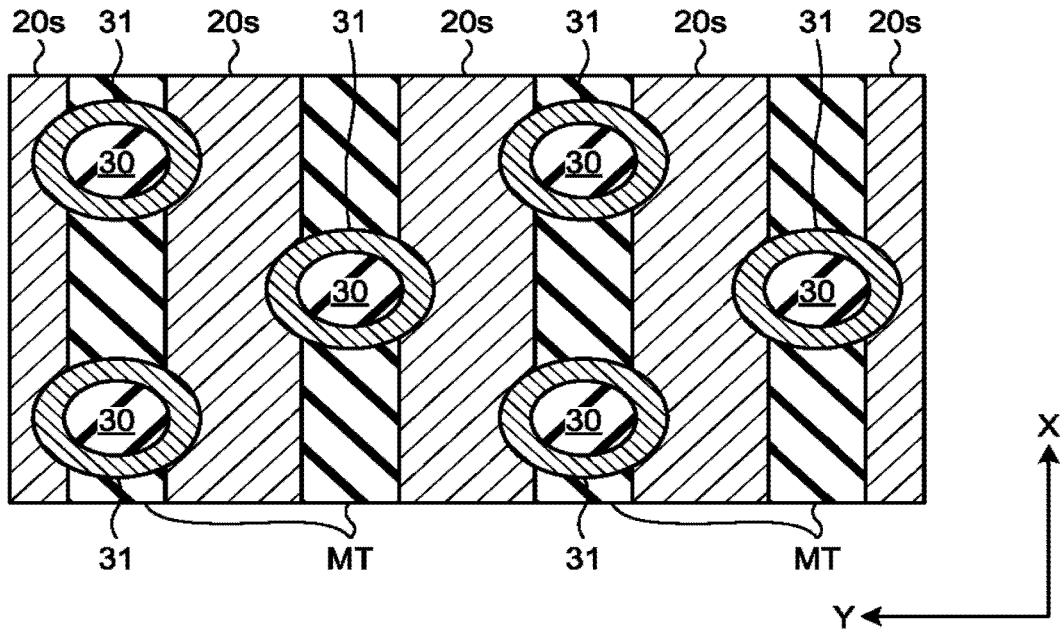
FIGS. 11A and 11B are flow diagrams illustrating an example of a procedure of a manufacturing process of a semiconductor storage device according to an embodiment.
Figure 11B:
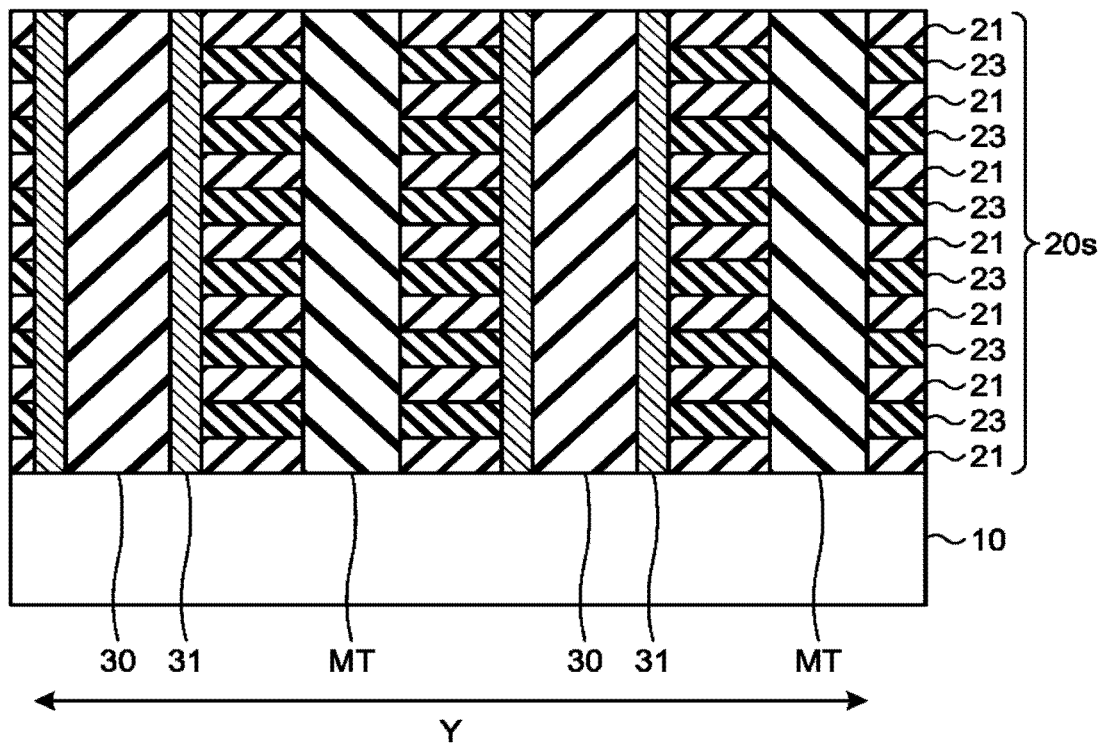

As illustrated in FIGS. 11A and 11B, the memory layer 31 is formed by stacking, in order from the inner wall side of the memory holes AH, a block insulating layer, a charge accumulation layer, a tunnel insulating layer, and a channel layer in the memory hole AH. The channel layer is formed also on the bottom surface of the memory hole AH. The inside of the memory layer 31 is filled with insulating material so that the core portion 30 is formed. After that, the slit ST (refer to FIG. 2) penetrating through the stack 20s is formed.

Figure 12A:
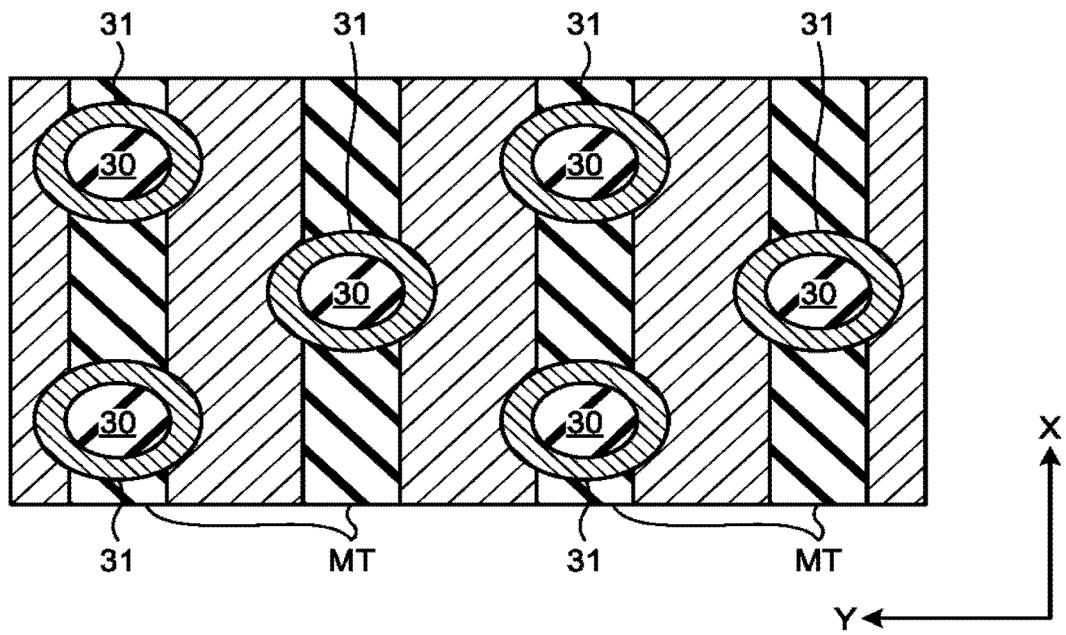
FIGS. 12A and 12B are flow diagrams illustrating an example of a procedure of a manufacturing process of a semiconductor storage device according to an embodiment.
Figure 12B:
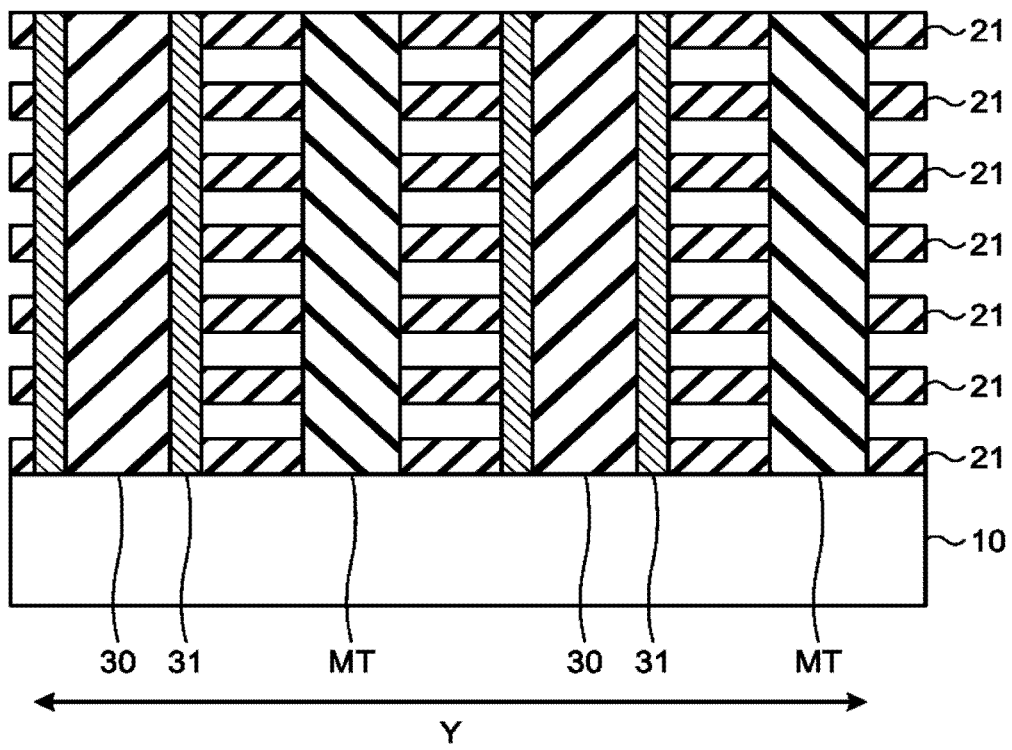

As illustrated in FIGS. 12A and 12B, the sacrificial layer 23 of the stack 20c is removed via the slit ST. The plurality of the insulating layers 21 stacked between the sacrificial layers 23 are supported by the insulating layers MT and the core portions 30 covered with the memory layers 31, and remain in a state of maintaining gaps generated by the removal of the sacrificial layers 23.

Figure 13A:
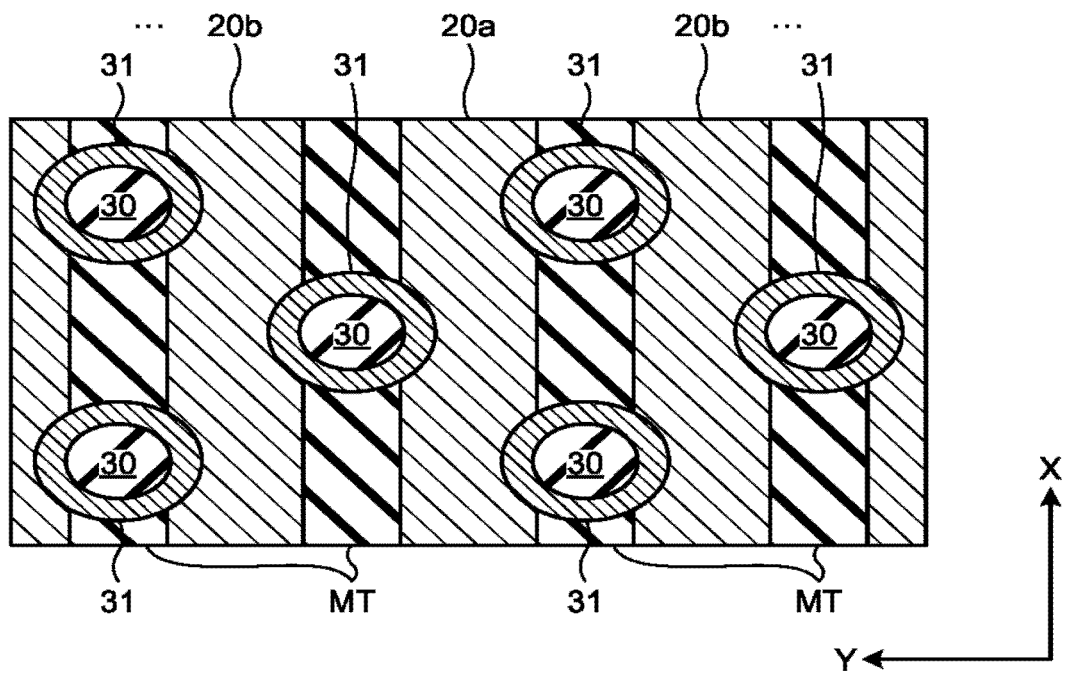
FIGS. 13A and 13B are flow diagrams illustrating an example of a procedure of a manufacturing process of a semiconductor storage device according to an embodiment.
Figure 13B:
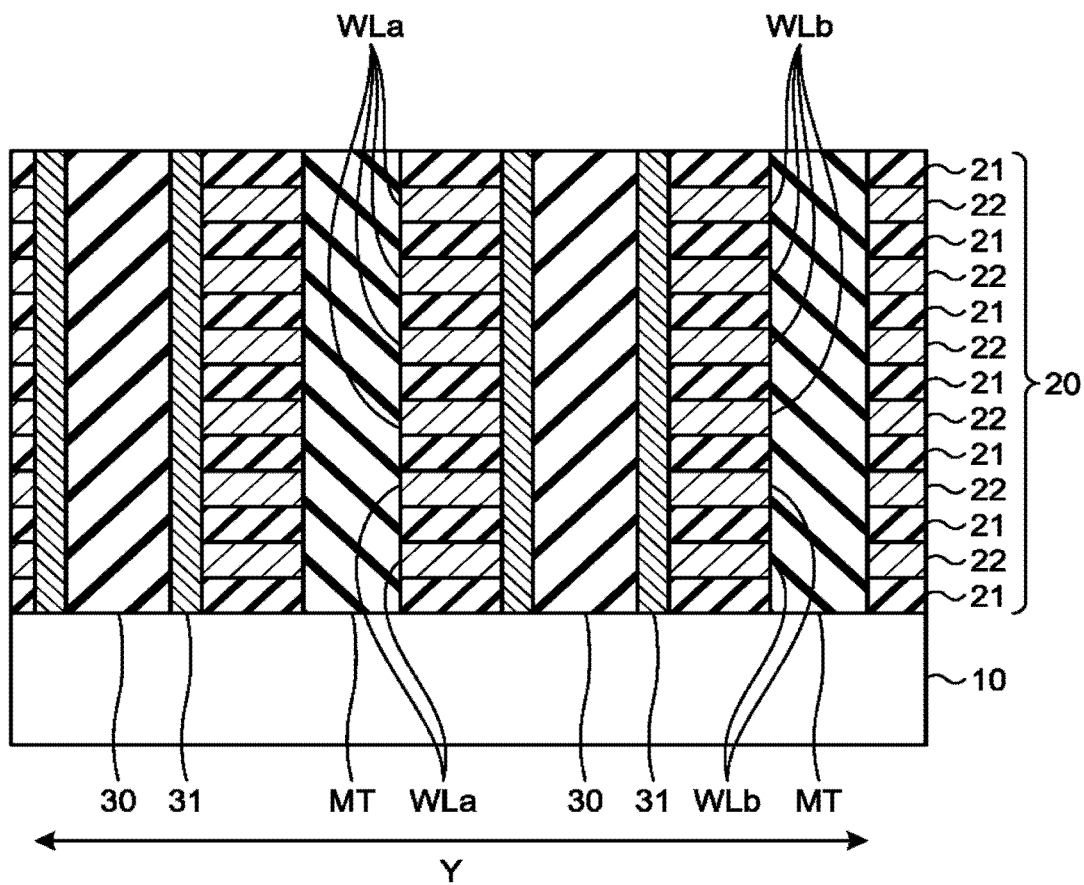

As illustrated in FIGS. 13A and 13B, the conductive layers 22 (the word lines WLa and WLb) are formed by filling the gaps removal of the sacrificial layers 23, with conductive material. In addition, the plurality of stacks 20a and 20b separated by the insulating layers MT are thereby formed. After that, a source line contact may be formed by filling the slit ST with conductive material.

Figure 14A:
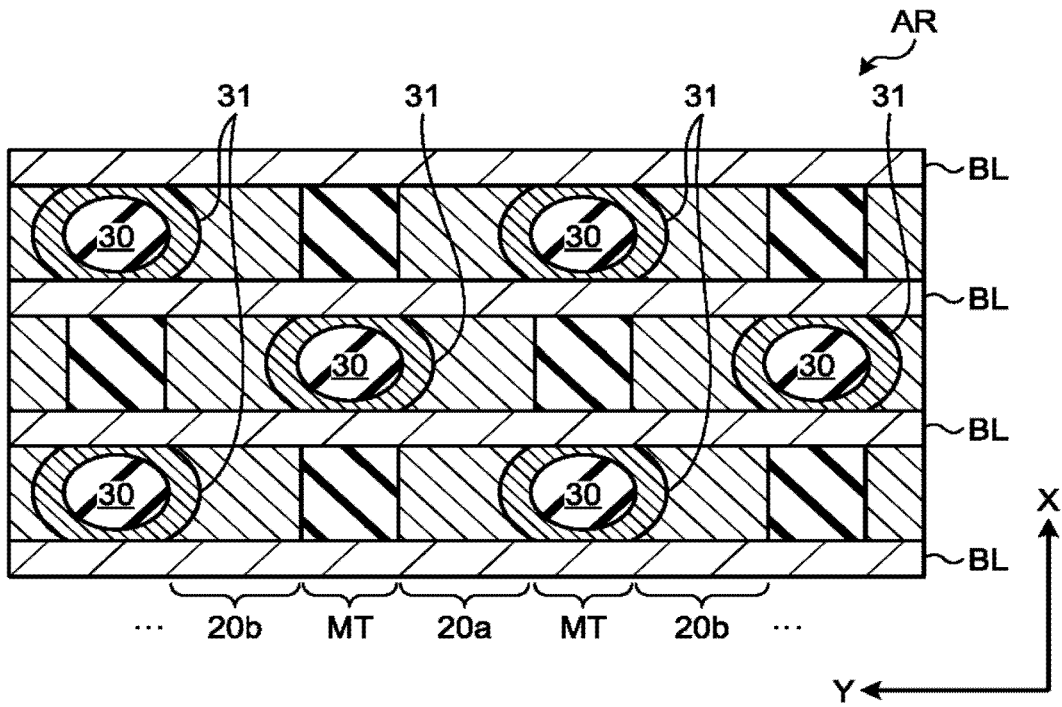
FIGS. 14A and 14B are flow diagrams illustrating an example of a procedure of a manufacturing process of a semiconductor storage device according to an embodiment.
Figure 14B:
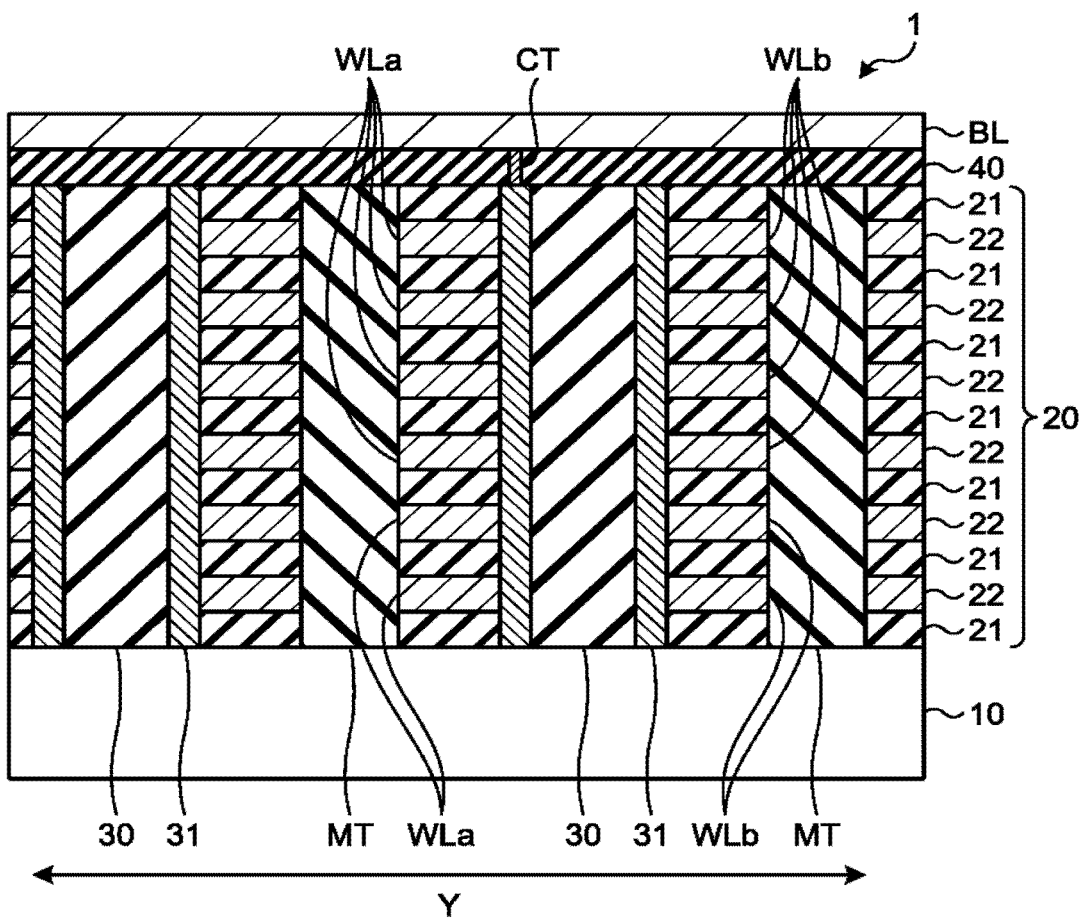

As illustrated in FIGS. 11A and 14B, the insulating layer 40 is formed on the stack 20 and the contact CT is formed in the insulating layer 40. In addition, the plurality of bit lines BL is formed on the insulating layer 40.

Through the above-described procedures, the manufacturing process of the semiconductor storage device 1 according to an embodiment ends.

(Comparative Example)

A manufacturing process of a semiconductor storage device according to a comparative example will be described using FIGS. 15A to 16C. In the semiconductor storage device according to the comparative example, a manufacturing process is performed without forming memory holes prior to the formation of insulating layers separating word lines. With this configuration, various types of issues to be described below are generated.

Figure 15A:
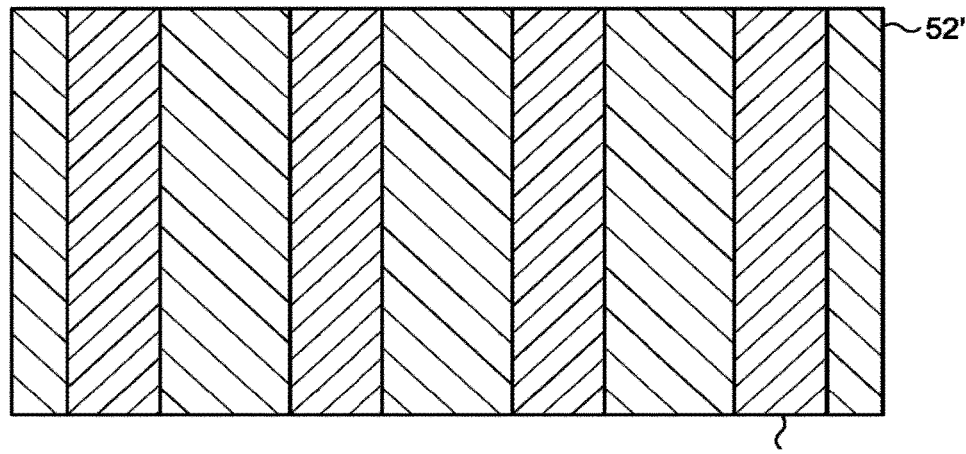
FIGS. 15A to 15C are flow diagrams illustrating an example of a procedure of a manufacturing process of a semiconductor storage device according to a comparative example.

As illustrated in FIG. 15A, a CVD carbon layer 52' having a line and space pattern is formed on a stack 20s' in which insulating layers and sacrificial layers are stacked on a substrate.

Figure 15B:
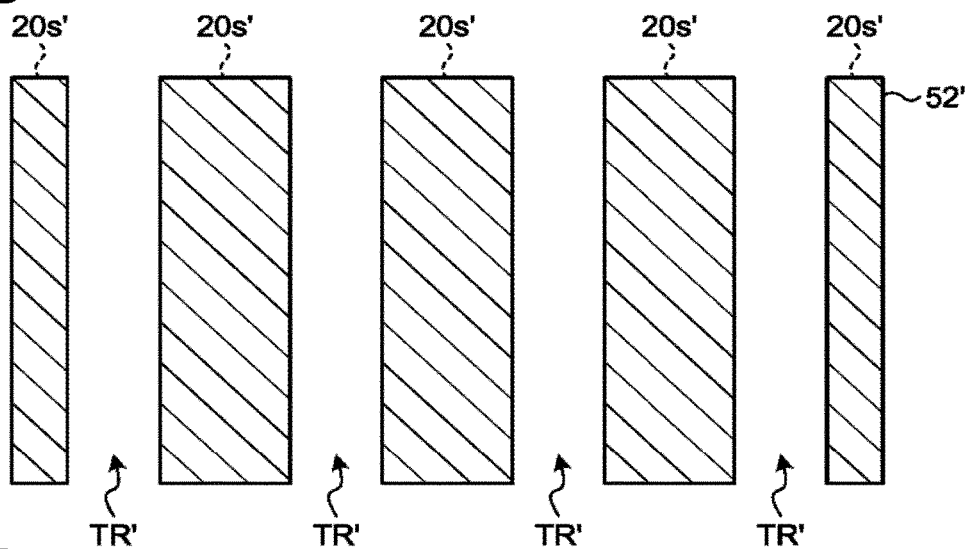

As illustrated in FIG. 15B, a plurality of grooves TR' penetrating through the stack 20s' is formed. The stack 20s' is separated into a plurality of stacks 20s' having line shapes.

Figure 15C:
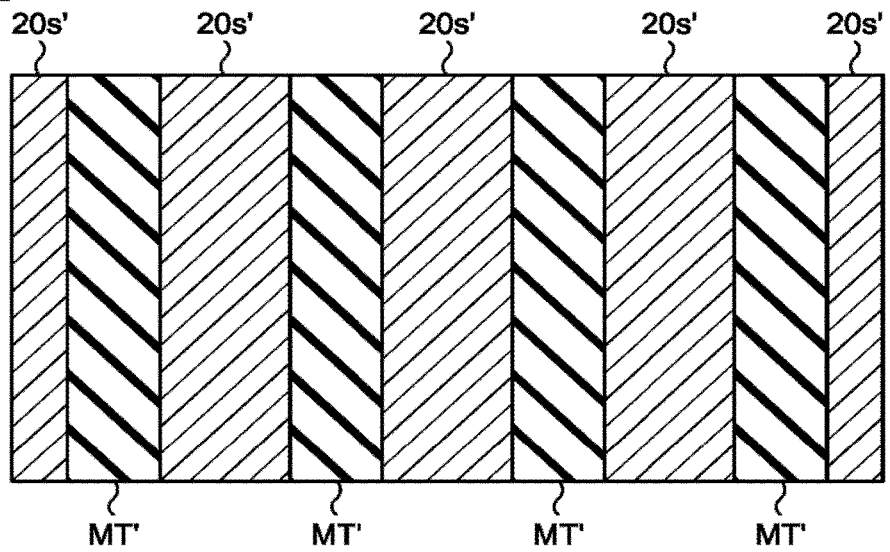

As illustrated in FIG. 15C, the grooves TR' provided between the stacks 20s' are filled with insulating material so that the insulating layers MT' are formed.

Figure 16A:
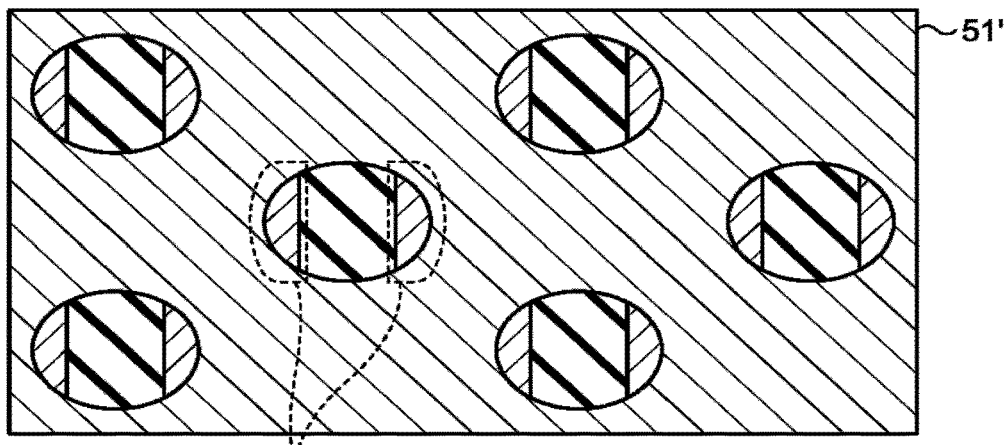
FIGS. 16A to 16C are flow diagrams illustrating an example of a procedure of a manufacturing process of a semiconductor storage device according to a comparative example.

As illustrated in FIG. 16A, a CVD carbon layer 51' having a hole pattern is formed on the stack 20s'. At this time, the CVD carbon layer 51' is formed in such a manner that hole patterns are disposed on the insulating layers MT, and projecting portions PR' projecting toward the both sides of the stack 20s' are formed. The projecting portions PR' are portions corresponding to ears of an oval coin if a memory hole AH' has an oval shape.

Figure 16B:
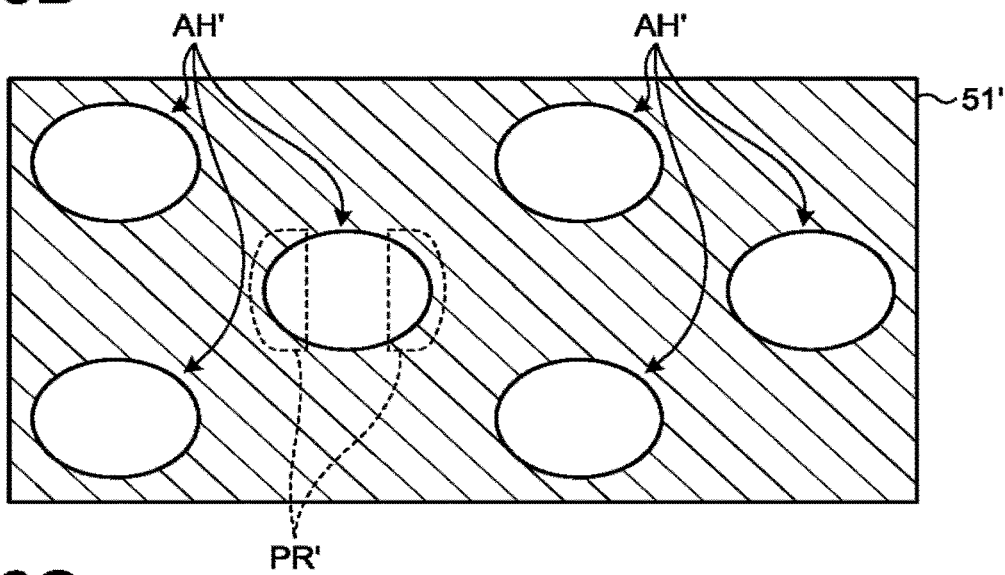

As illustrated in FIG. 16B, the memory holes AH' penetrating through the stacks 20s' and the insulating layers MT' in opening portions of the CVD carbon layer 51' are formed.

Figure 16C:
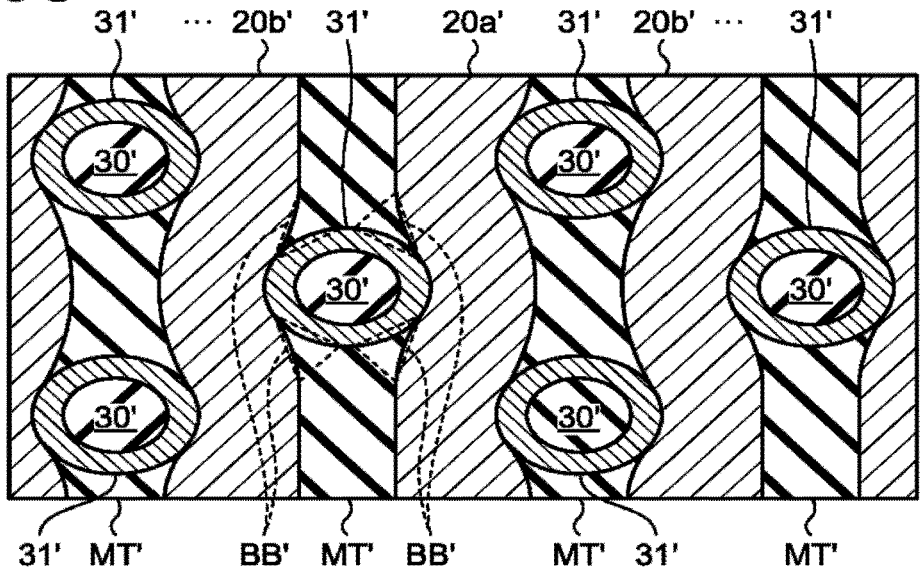

As illustrated in FIG. 16C, core portions 30' covered with memory layers 31' are formed in the memory holes AH'.

Here, in FIG. 15B, each of the stack 20s' separated by the plurality of grooves TR' to have fine line shapes extending in the X direction includes 100 stacked sacrificial layers, for example, and is in a state of rising with no support. Thus, the stack 20s' may collapse in some cases.

In addition, in FIG. 16B, for penetrating through the stack 20s' and the insulating layers MT', it is necessary to collectively remove, by dry etching or the like, a stack structure of insulating layers and sacrificial layers that corresponds to the portion of the stack 20s', and a bulk insulating layer corresponding to the portions of the insulating layers MT'.

Nevertheless, normally, an etching rate of the bulk insulating layer tends to be higher than that of the stack structure of insulating layers and sacrificial layer. Thus, on the bottom surface of the memory hole AH', level difference may occur at a boundary portion of the stack 20s' and the insulating layer MT' If a condition with a low etching rate is used, such level difference can be reduced, but productivity may deteriorate.

In addition, due to a difference in etching characteristic between the stack structure of insulating layers and sacrificial layer, and the bulk insulating layer, as an etching depth increases, an amount of projection to the stack 20s' portion of the memory hole AH' (area of projecting portion PR') is likely to decrease. Thus, in some cases, the memory hole AH' having an ellipse or oval shape on the top surface has a rectangular shape similar to the insulating layer MT' in an opening portion, on the bottom surface. At this time, a ratio of a diameter in the Y direction that has been originally long, with respect to a diameter in the X direction that has been originally short becomes 1.0 or less.

In addition, in FIG. 16C, due to a difference in etching rate between the stack 20s' portion inside the memory hole AH' and the insulating layer MT' portion outside the memory hole AH', the memory hole AH' having a long diameter in the Y direction sometimes swells in the X direction. With this configuration, the shape of the memory hole AH' sometimes deforms. In addition, a width of the insulating layer MT' on the outer circumference of the memory hole AH' widens, and a bird's beak BB' is formed in some cases.

Figure 17:
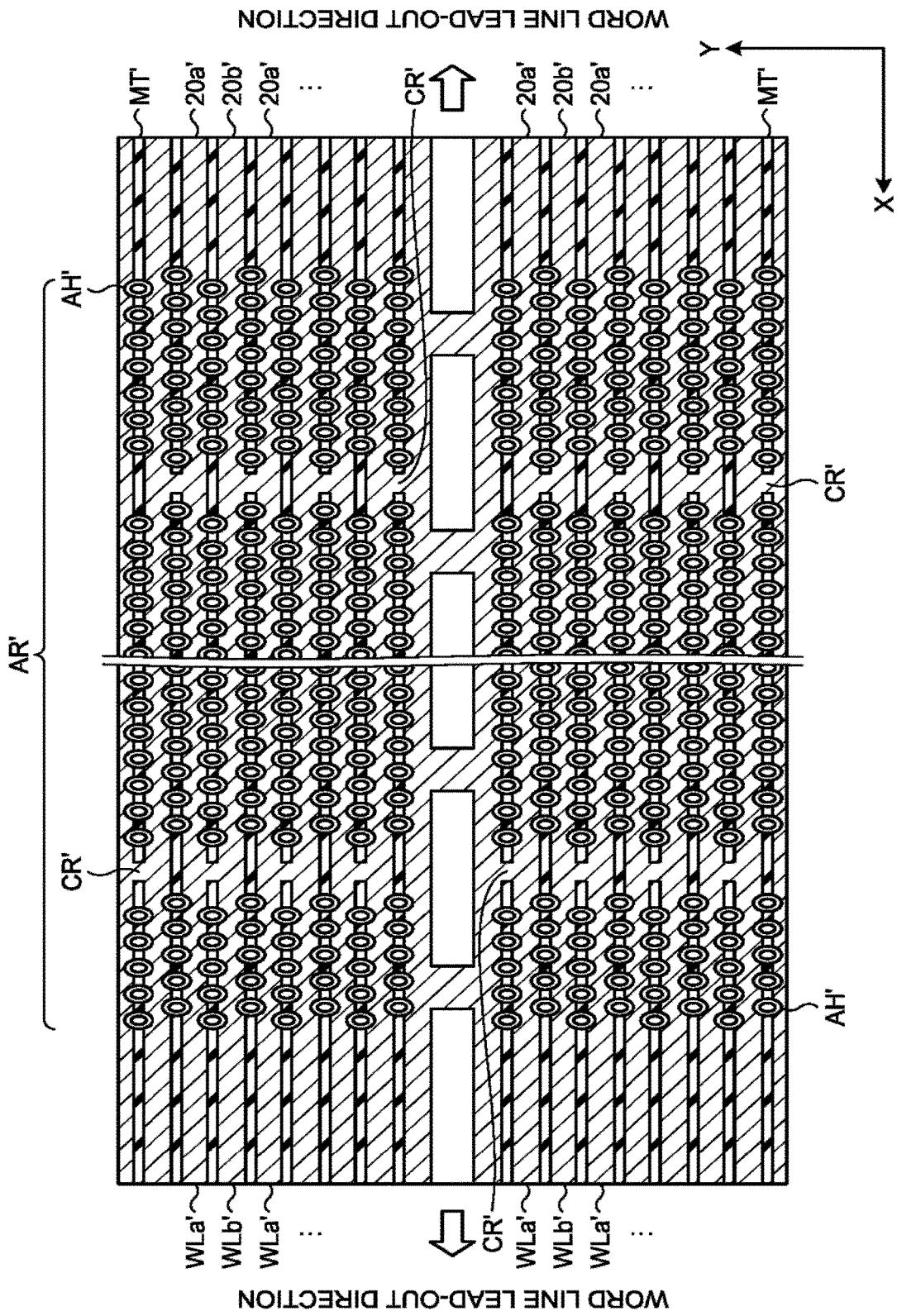
FIG. 17 is a diagram illustrating a cell array of a semiconductor storage device according to a comparative example.

In addition, for suppressing collapse of the stack 20s' in FIG. 15B, it is considered to bridge a part of the insulating layer MT' extending in the X direction. This state is illustrated in FIG. 17. FIG. 17 is a diagram illustrating a cell array AR' of a semiconductor storage device according to a comparative example.

As illustrated in FIG. 17, in the cell array AR', the insulating layers MT' extend in the X direction being a lead-out direction of word lines WLa' and WLb', and are periodically arrayed in the Y direction. Nevertheless, the insulating layers MT' are in a state of being partially interrupted in the X direction. With this configuration, a bridge portion CR' in which adjacent stacks 20a' and 20b' are partially connected is formed, and the stacks 20a' and 20b' having line shapes can be configured to support each other.

Nevertheless, if the bridge portion CR' is provided in the cell array AR', a region in which memory cells can be arrayed is narrowed by a region corresponding to the bridge portion CR', and the density of memory cells declines. Eventually, the cell array AR' increases. In addition, such a configuration is in a trade-off state with respect to collapse suppression of the stack 20s, and an increase in the density of memory cells, and a design margin of a semiconductor storage device is narrowed.

In the semiconductor storage device 1 according to an embodiment, the memory holes AH filled with the sacrificial layers 24 are formed prior to the formation of the insulating layers MT. With this configuration, when the insulating layers MT are formed, the stacks 20s separated by the insulating layers MT are bridged by the plurality of sacrificial layers 24, and the stacks 20s can be configured to support each other. Thus, the structure of the stack 20s can be reinforced, and the collapse of the stack 20s can be suppressed.

In addition, unlike the comparative example in FIG. 17, there is no need to separately make a space for the bridge portion CR', and the region in the cell array AR is not tightened. Thus, memory cells MC can be arranged at high density, and an area of the cell array AR can be reduced.

In the semiconductor storage device 1 according to an embodiment, when the memory holes AH are formed, the insulating layers MT having a higher etching rate than that of the stack 20s do not exist around the memory holes AH. Thus, the memory holes AH can be prevented from swelling in the X direction by the influence of the insulating layers MT extending in the X direction. With this configuration, the deformation in the shape of the memory holes AH can be suppressed, and in addition, the formation of the bird's beak BB' around the memory holes AH can be suppressed. This contributes to enhancement in electrical characteristic of the memory cells MCa and MCb, and suppression of a variation in electrical characteristic.

In the semiconductor storage device 1 according to an embodiment, the memory holes AH are formed so as to penetrate through the stack 20s in which the insulating layers 21 and the sacrificial layers 23 are stacked. With this configuration, the memory holes AH can be formed by a process having a wider process margin than that of a semiconductor storage device according to a comparative example that causes memory holes to collectively penetrate through a stack structure of insulating layers and sacrificial layers, and a bulk insulating layer.

Thus, an etching rate difference is difficult to be generated in the memory holes AH, and the memory holes AH having approximately flat bottom surfaces with no level difference can be formed. This contributes enhancement in electrical characteristic of the memory cells MCa and MCb, and suppression of a variation in electrical characteristic.

In addition, a difference in etching characteristic is difficult to be generated in the memory holes AH, and an ellipse or oval shape on the top surface of the memory hole AH is easily maintained also on the bottom surface of the memory hole AH. In other words, it is possible to prevent the bottom surface of the memory hole AH, from approaching a rectangular shape. This contributes to enhancement in electrical characteristic of the memory cells MCa and MCb, and suppression of a variation in electrical characteristic.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor storage device, the manufacturing method comprising:
    forming a stack in which a plurality of first insulating layers and a plurality of first sacrificial layers are alternately stacked;
    forming a memory hole penetrating through the stack;
    filling the memory hole with a second sacrificial layer;
    forming a groove penetrating the stack so as to divide the stack to a first stack and a second stack, at a position intersecting with substantially a center of the memory hole filled with the second sacrificial layer, the groove having a smaller width than a diameter of the memory hole,
    replacing the first sacrificial layer of the stack with a conductive layer so as to form a plurality of word lines; and
    filling the memory hole with a memory layer, and forming a pillar having a plurality of first memory cells to be arrayed on a side surface of the pillar facing the first stack and a plurality of second memory cells to be arrayed on a side surface of the pillar facing the second stack.

2. The manufacturing method of a semiconductor storage device according to claim 1, wherein, at the forming of the groove, the second sacrificial layer is left in the groove.

3. The manufacturing method of a semiconductor storage device according to claim 2, wherein, at the forming of the groove, stacks are bridged by the second sacrificial layer.

4. The manufacturing method of a semiconductor storage device according to claim 3, wherein
    the memory hole includes a plurality of memory holes, and
    at the forming of the plurality of memory hole, in a cell array formation planned region, the plurality of memory holes are periodically formed without interruption in a predetermined direction.

5. The manufacturing method of a semiconductor storage device according to claim 4, wherein, at the forming of the groove, in the cell array formation planned region, the groove is formed so as to extend continuously in a direction in which the memory holes are arrayed.

6. The manufacturing method of a semiconductor storage device according to claim 4, wherein, at the forming of the plurality of memory holes, each memory hole of the plurality of memory holes is formed in such a manner that an opened surface of the memory hole has an ellipse or oval shape having a long diameter in a direction intersecting with the predetermined direction, and a ratio of a long diameter of an end surface of the memory hole with respect to a short diameter of the end surface of the memory hole becomes larger than 1.

7. The manufacturing method of a semiconductor storage device according to claim 2, wherein, at the forming of the groove, the groove is formed in a state in which an end surface of the memory hole is covered with the second sacrificial layer.

8. The manufacturing method of a semiconductor storage device according to claim 1, the manufacturing method further comprising filling the groove with a second insulating layer, and forming a separation layer separating the stack.

* * * * *